(12) United States Patent
Chen

(10) Patent No.: US 7,035,112 B2
(45) Date of Patent: Apr. 25, 2006

(54) AUTOMATIC SWITCH

(75) Inventor: Kevin Chen, Shijr (TW)

(73) Assignee: ATEN International Co., Ltd., Shijr (TW)

( * ) Notice: Subject to any disclaimer, the term of this patent is extended or adjusted under 35 U.S.C. 154(b) by 289 days.

(21) Appl. No.: 10/190,015

(22) Filed: Jul. 8, 2002

(65) Prior Publication Data

US 2004/0001323 A1  Jan. 1, 2004

(51) Int. Cl.
*H05K 5/00* (2006.01)
*H05K 5/04* (2006.01)
*H05K 5/06* (2006.01)

(52) U.S. Cl. ............... 361/752; 361/800; 361/827; 361/784; 439/606; 439/736; 439/264

(58) Field of Classification Search ........ 361/752, 361/797, 724, 714, 784–785, 800, 827; 439/606, 439/736, 502, 505, 654, 264, 739; 257/99; 348/836
See application file for complete search history.

(56) References Cited

U.S. PATENT DOCUMENTS

| | | | |
|---|---|---|---|
| 2,667,553 A | 1/1954 | Moorhead et al. | |
| 2,870,287 A | 1/1959 | Corbitl et al. | |
| 4,103,252 A | 7/1978 | Bobick | |
| 4,927,787 A | 5/1990 | Patel | |
| 4,927,987 A | 5/1990 | Kirchgessner | |
| 5,192,226 A * | 3/1993 | Wang | 439/502 |
| 5,260,532 A | 11/1993 | Tinder et al. | |
| 5,708,897 A * | 1/1998 | Manabe et al. | 396/535 |
| 5,792,986 A | 8/1998 | Lee | |
| 6,160,485 A * | 12/2000 | Krakovich | 340/635 |
| 6,329,616 B1 | 12/2001 | Lee | |
| 6,378,014 B1 * | 4/2002 | Shirley | 710/100 |
| 6,449,866 B1 * | 9/2002 | Murray | 33/758 |
| 6,498,890 B1 | 12/2002 | Kimminau | |
| 6,521,836 B1 | 2/2003 | Simonazzi | |
| 6,609,034 B1 * | 8/2003 | Behrens et al. | 700/19 |
| 6,671,756 B1 * | 12/2003 | Thomas et al. | 710/73 |
| 2001/0023141 A1 * | 9/2001 | Chang | 439/76.1 |
| 2001/0053627 A1 | 12/2001 | Armistead et al. | |
| 2003/0223185 A1 * | 12/2003 | Doczy et al. | 361/680 |

* cited by examiner

*Primary Examiner*—Randy W. Gibson
*Assistant Examiner*—Hung S. Bui
(74) *Attorney, Agent, or Firm*—Jeffer, Mangels, Butler & Mamaro LLP

(57) ABSTRACT

An automatic switch includes a main body having connector ports provided thereon, more than one or two sets of cable-connected connectors directly extended from the main body, and a circuit board provided in the main body and electrically connected to the sets of cable-connected connectors via signal cables. The main body has an integral enclosure formed through multiple times of injection molding to include a circuit-protecting layer for enclosing the circuit board, an outer case enclosing the circuit-protecting layer, and an anti-slipping layer coating an outer surface of the outer case.

23 Claims, 4 Drawing Sheets

AUTOMATIC SWITCH

BACKGROUND OF THE INVENTION

The present invention relates to an automatic switch for a user to automatically switch between two or more computer configurations, and more particularly to an automatic switch that has an integrally injection-molded enclosure to provide good weather-resistance, impact-resistance, and absolute protection of an internal circuit board thereof.

The highly developed electronic and information technologies enable people to collect required information or to trade directly over networks via computers, making computers a requisite tool in people's work, learning, entertainments, leisure activities, and daily life.

For people to access two or more computers at the same time, there is developed an automatic switch to enable a user to automatically switch among different signal paths. FIG. 1 shows a conventional automatic switch 40 that is configured into a box 41. The box 41 is internally provided with a circuit board (not shown). Ports 42, 43, and 44 for various types of signal cable connectors are provided on peripheral walls of the box 41. Inmost cases, the box 41 includes outer walls that are made of metal material or rigid plastic material and assembled together by means of screws (not shown). The automatic switch 40 is normally positioned on a host enclosure of a computer configuration and tends to unexpectedly fall off the host enclosure to result in a damaged circuit board due to vibration. Moreover, when a high humidity exists, moisture in the air tends to attach to the circuit board to cause short circuit. Repair or maintenance of the circuit board is therefore required.

SUMMARY OF THE INVENTION

A primary object of the present invention is to provide a plug-type automatic switch for a user to access and control multiple computer configurations through one single switch. The automatic switch includes a main body externally provided with connector ports and enclosing an internal circuit board. The main body has an integrally injection-molded plastic enclosure to provide good weather-resistance, impact-resistance, and absolute protection of the internal circuit board and circuits thereon.

The automatic switch of the present invention also includes more than one or two sets of cable-connected connectors directly extended from the main body and electrically connected to the internal circuit board via signal cables.

The integrally injection-molded enclosure of the main body includes a circuit-protecting layer for enclosing the circuit board, an outer case enclosing the circuit-protecting layer, and an anti-slipping layer coating an outer surface of the outer case.

The circuit-protecting layer of the main body is made of a plastic material having a low melting point to avoid damages to circuits provided on the circuit board during the injection molding.

The outer case of the main body has good strength and high rigidity and therefore provides excellent protection to the internal circuit board and the entire main body of the automatic switch.

The anti-slopping layer of the main body has soft surface to enable firm holding of the main body and convenient plugging and unplugging of signal cables in and from the main body.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
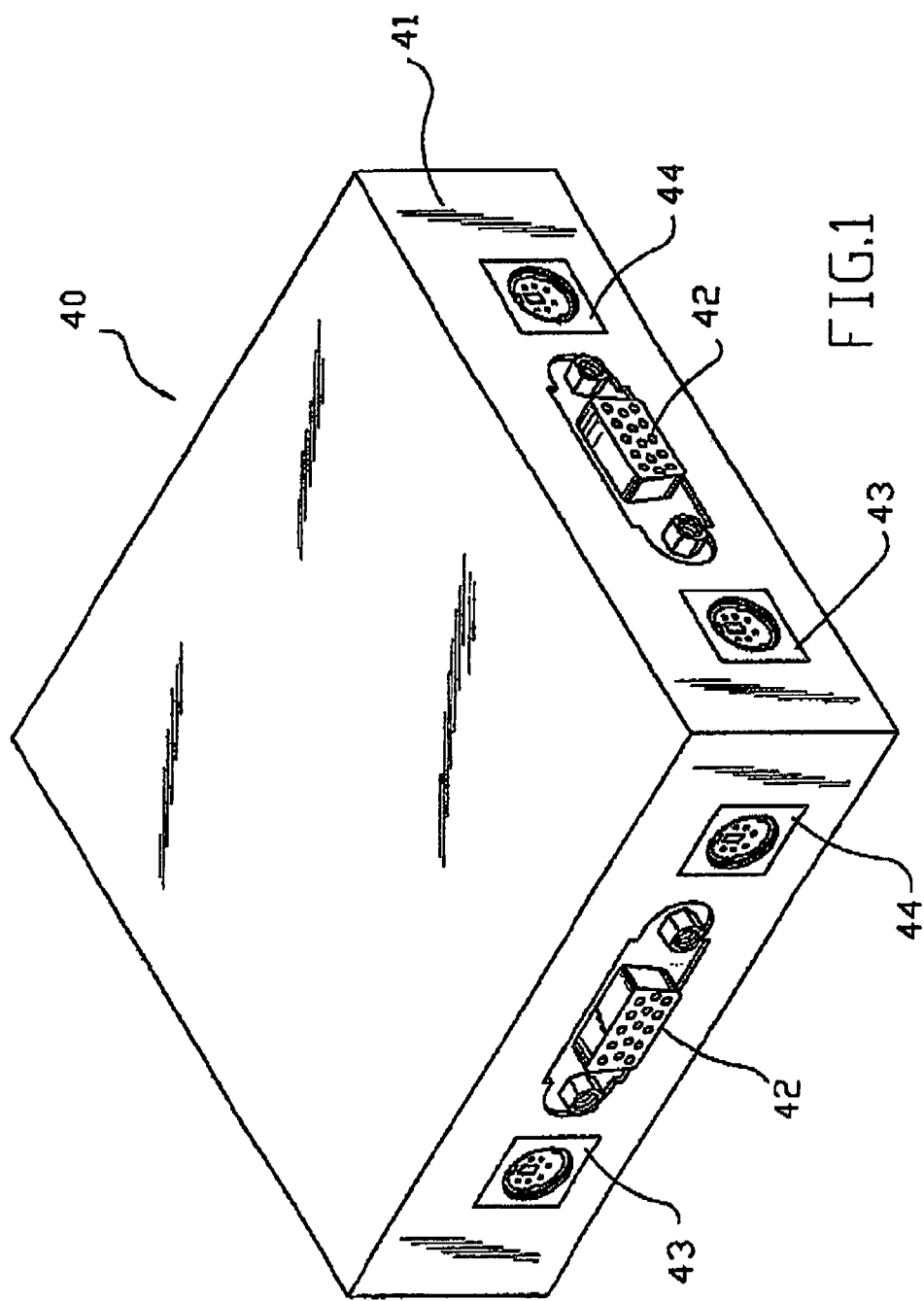
FIG. 1 is a perspective view of a conventional automatic switch for switching between two or more computer configurations.
Figure 2:
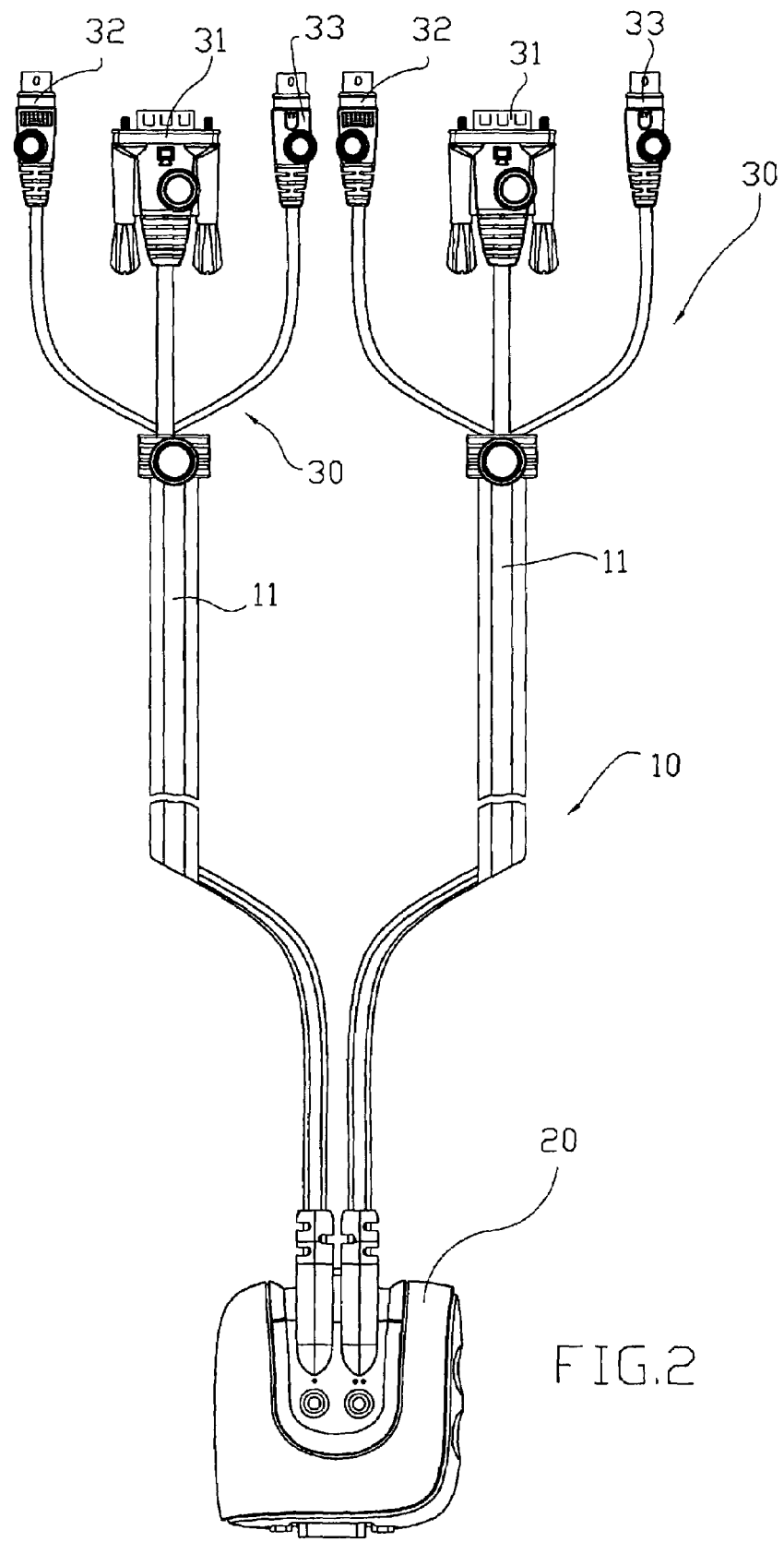
FIG. 2 is a front view of an automatic switch according to the present invention.

Please refer to FIG. 2 that is a front view of an automatic switch 10 according to an embodiment of the present invention. As shown, the automatic switch 10 includes a main body 20 having connector ports provided on external walls thereof, and more than one or two sets of cable-connected connectors 30 directly extended from the main body 20.

Figure 3:
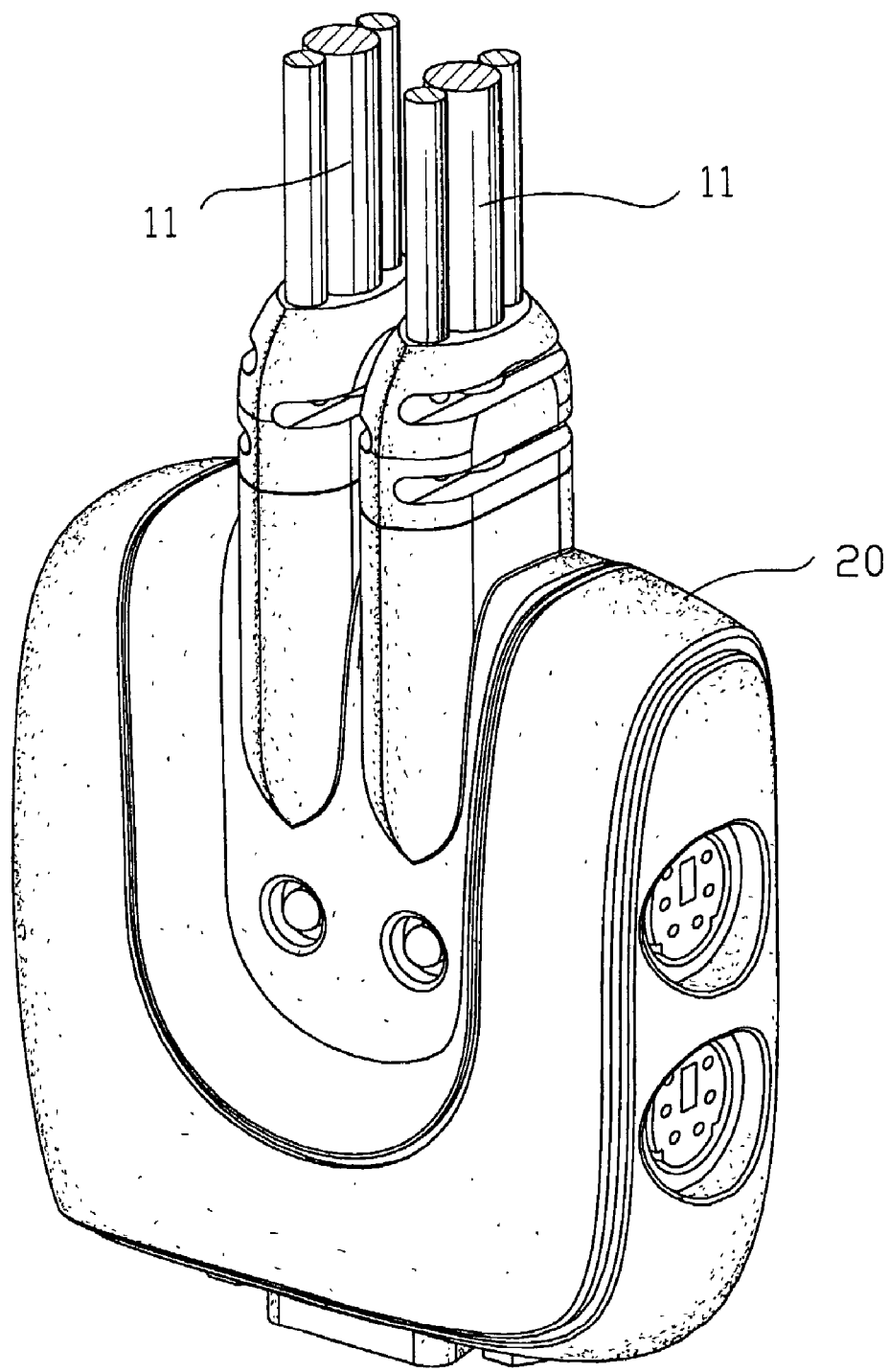
FIG. 3 is a perspective view of a main body of the automatic switch of the present invention.
Figure 4:
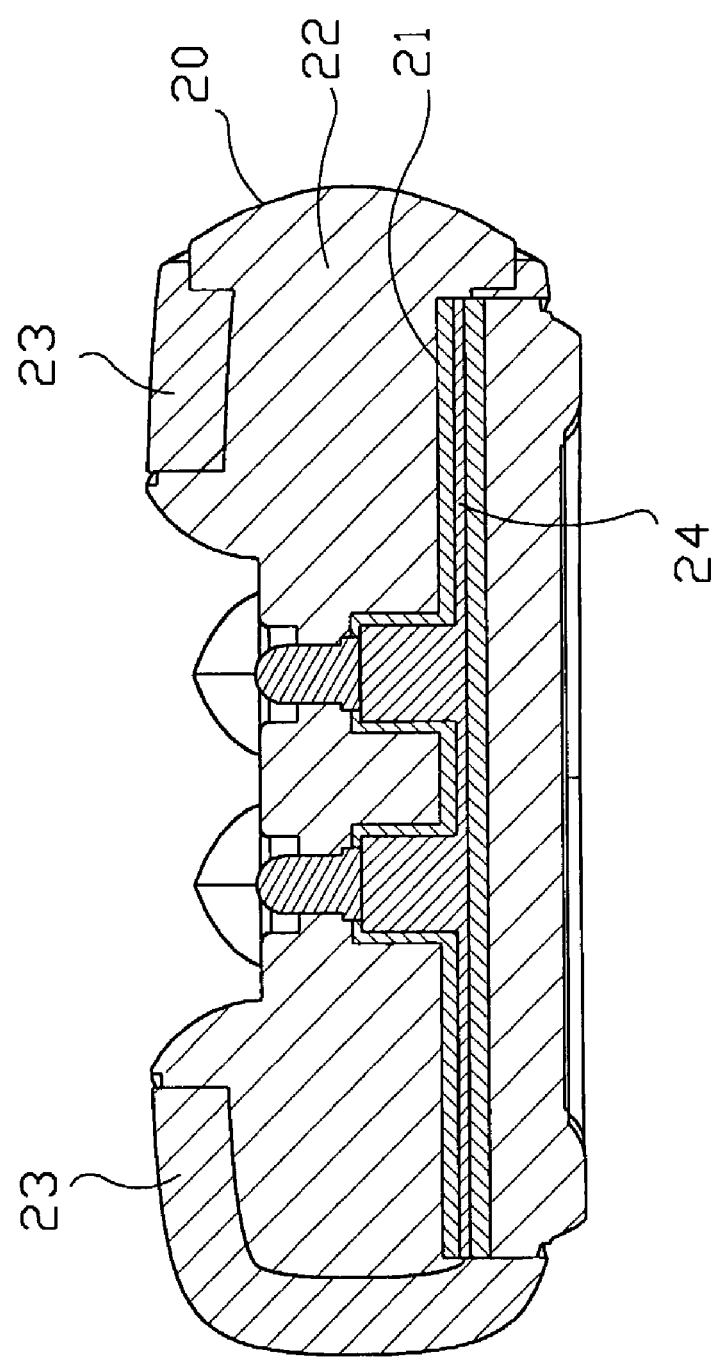
FIG. 4 is a cross-sectional view of the main body of the automatic switch of the present invention.

Please refer to FIGS. 3 and 4 that are perspective and cross-sectional views, respectively, of the main body 20 of the automatic switch 10 of the present invention. The main body 20 has an integral enclosure that is formed through three times of injection molding to include a circuit-protecting layer 21 for enclosing a circuit board 24 provided in the main body 20, an outer case 22 enclosing the circuit-protecting layer 21, and an anti-slipping layer 23 coating an outer surface of the outer case 22.

It is to be noted that the circuit-protecting layer 21 of the main body 20 is in completely close contact with the circuit board 24, so that the circuit board 24 is entirely isolated from and protected against external environments. Electronic elements (not shown) soldered onto the circuit board 24 are not subjected to undesired looseness or separation even if the main body 20 is fiercely vibrated or impacted. Moreover, the circuit board 24 enclosed in the circuit-protecting layer 21 is also isolated from moisture in the air to therefore always maintain good electric performance. That is, the circuit board 24 is best protected in the main body 20.

The circuit-protecting layer 21 enclosing the circuit board 24 is made of a plastic material having a low melting point to avoid damages to circuits on the circuit board 24 due to a high temperature in the course of injection molding of the circuit-protecting layer 21.

The outer case 22 enclosing the circuit-protecting layer 21 is made of a plastic material that shows high strength and high rigidity after being molded into a desired shape. The outer case 22 occupies a major part of the enclosure of the main body 20 and serves to ensure a well-shaped overall appearance of the main body 20 while protecting the internal circuit board 24.

The anti-slipping layer 23 coating the outer surface of the outer case 22 is made of a plastic material that provides a soft surface after being molded to enable a user to hold the switch without the risk of easily slipping off the main body 20. Cables can therefore be more easily plugged or unplugged in or from the main body 20.

As can be seen from FIG. 2, each set of the cable-connected connectors 30 includes a central processing unit (CPU) signal cable connector 31, a keyboard signal cable connector 32, and a mouse signal cable connector 33. The cable-connected connectors 31, 32, and 33 are adapted to plug in corresponding connectors (not shown) on computer configurations to which the automatic switch 10 is to be connected. As can be seen from FIG. 4, the circuit board 24 is electrically connected to the sets of cable-connected connectors 30 via signal cables 11.

In brief, the automatic switch 10 of the present invention uses the main body 20 having cable-connected connector sets 30 to replace the conventional box-type switch 40, enabling the switch 10 to be used in a more convenient manner. Moreover, the enclosure of the main body 20 of the automatic switch 10 is integrally formed through multiple times of injection molding to protect circuits provided on the internal circuit board 24, making the automatic switch 10 safer and more convenient for use.

What is claimed is:

1. A switch comprising:
    a body;
    a switching circuit contained within the body;
    a set of connector ports electrically coupled to the switching circuit; and,
    a plurality of cables fixedly attached to and extending from the body, each cable in the plurality of cables having a plurality of connector plugs, wherein each connector plug in the plurality of connector plugs for one of the cables in the plurality of cables are matched a respective connector plug in another one of the cables in the plurality of cables, and wherein the switching circuit switches to connect each of the set of connector ports to one of the plurality of cables.

2. The switch of claim 1, wherein the body includes a circuit-protecting layer surrounding the switching circuit.

3. The switch of claim 2, wherein the circuit-protecting layer is comprised of a layer of injection-molded plastic.

4. The switch of claim 3, wherein the layer of injection-molded plastic has a low melting point.

5. The switch of claim 2, wherein the body includes an outer case surrounding the circuit-protecting layer.

6. The switch of claim 5, wherein the outer case has a rigid outer surface.

7. The switch of claim 1, wherein the body includes an anti-slipping layer coating.

8. The switch of claim 7, wherein the anti-slipping layer coating has a soft outer surface.

9. The switch of claim 1, wherein the switching circuit includes a circuit board and the body includes a circuit-protecting layer enclosing the circuit board.

10. The switch of claim 9, wherein the circuit board includes a plurality of electronic elements enclosed in the circuit-protecting layer.

11. The switch of claim 1, wherein the switching circuit includes a circuit board and the circuit board is sealed within a circuit-protecting layer.

12. The switch of claim 1, wherein the plurality of cables are fixedly attached to the body through a molded attachment element.

13. The switch of claim 1, wherein a first end of each of the plurality of cables is integrated into the body.

14. The switch of claim 1, wherein the set of connector ports contains a peripheral port to connect a computer peripheral.

15. The switch of claim 1, wherein the set of connector ports contains a keyboard port to connect a keyboard.

16. The switch of claim 1, wherein the set of connector ports contains a mouse port to connect a mouse.

17. The switch of claim 1, wherein set of connector ports contains a video port to connect a display.

18. The switch of claim 1, wherein the plurality of cables includes a first set of computer cables for coupling the switching circuit to a first computer.

19. The switch of claim 18, wherein the first set of computer cables comprises:
    a keyboard cable including a keyboard connector plug;
    a mouse cable including a mouse connector plug; and,
    a video cable including a display connector plug.

20. The switch of claim 1, wherein the plurality of cables includes a second set of computer cables for coupling the switching circuit to a second computer.

21. A method comprising the steps of:
    providing a body;
    enclosing a switching circuit within the body;
    integrating a first computer cable and a second computer cable into the body, each of the first computer cable and the second computer cable including a first end electrically coupled to the switching circuit and a second end having a plurality of connector plugs, each connector plug in the plurality of connector plugs in the first computer cable being matched to a corresponding one of the plurality of connector plugs in the second computer cable; and,
    providing a plurality of connector ports on a surface of the body, the plurality of connector ports electrically coupled to the switching circuit;
    wherein the switching circuit electrically switches the plurality of connector ports between the plurality of connector plugs of the first computer cable and the second computer cable.

22. The method of claim 21, further comprising the steps of:
    connecting a computer peripheral to one of the plurality of connector ports; and,
    connecting a first connector plug from the first computer cable to a first computer.

23. The method of claim 22, further comprising the steps of:
    connecting a second connector plug from the second computer cable to a second computer; and,
    selectively switching the electrical connection of the computer peripheral from the first computer to the second computer.

* * * * *